US005818315A

United States Patent [19]

Moongilan

[11] Patent Number: 5,818,315
[45] Date of Patent: Oct. 6, 1998

[54] SIGNAL TRACE IMPEDANCE CONTROL USING A GRID-LIKE GROUND PLANE

[75] Inventor: Dheena Dayalan Moongilan, Marlboro, N.J.

[73] Assignee: Lucent Technologies Inc., Murray Hill, N.J.

[21] Appl. No.: 777,831

[22] Filed: Dec. 31, 1996

[51] Int. Cl.⁶ .................................................... H01P 3/08
[52] U.S. Cl. .............................................. 333/238; 333/1
[58] Field of Search ................. 333/1, 238; 174/117 FF, 174/117 M, 32, 36

[56] References Cited

U.S. PATENT DOCUMENTS

| | | | |
|---|---|---|---|
| 3,612,744 | 10/1971 | Thomas | 333/238 X |
| 4,855,537 | 8/1989 | Nakai et al. | 333/238 X |
| 5,300,899 | 4/1994 | Suski | 333/238 X |
| 5,479,138 | 12/1995 | Kuroda et al. | 333/238 X |
| 5,568,107 | 10/1996 | Buuck et al. | 333/238 |

OTHER PUBLICATIONS

Y.P. Tang and S.Y. Yang, "Transient Analysis of Tapered Lines Based on the Method of Series Expansion," IEEE Transactions on Microwave Theory and Techniques, vol. 44, No. 10, Oct. 1996, pp. 1742–1744.

Y.P. Tang, Z. Li and S.Y. Tang, "Transient Analysis of Tapered Transmission Lines Used as Transformers for Short Pulses," IEEE Transactions on Microwave Theory and Techniques, vol. 43, No. 11, Nov. 1995, pp. 2573–2578.

Robert E. Collin, "Foundations for Microwave Engineering," McGraw–Hill, New York, 1996, pp. 237–251.

Brian J. Minnis, "Designing Microwave Circuits by Exact Synthesis," Artech House, Boston, 1996, pp. 222–225 and 257–259.

Brian C. Wadell, "Transmission Line Design Handbook," Artech House, Boston, 1991, pp. 324–325.

Marek T. Faber et al., "Microwave and Millimeter–Wave Diode Frequency Multipliers," Artech House, Boston, 1995, pp. 110–113 and 338–340.

Primary Examiner—Paul Gensler

[57] ABSTRACT

Methods and apparatus for controlling signal line impedance in an electronic circuit board by altering the characteristics of a grid-like ground plane. The ground plane is arranged adjacent and parallel to a signal plane of the circuit board, and includes a grid-like pattern of conductors. The grid-like pattern of conductors forms a large number of grid elements. The size of the grid elements in a portion of the ground plane varies along at least a portion of the length of a corresponding signal trace of the signal plane in order to provide a desired impedance for the signal trace. The grid element size variation may be in accordance with a ramp function, a staircase function, a square wave function, as well as suitable combinations of these and other functions. This variation of grid element size in a grid-like ground plane provides cost-effective and flexible control of signal trace impedance, without requiring any alteration in signal trace or dielectric material characteristics.

32 Claims, 9 Drawing Sheets

SIGNAL TRACE IMPEDANCE CONTROL USING A GRID-LIKE GROUND PLANE

FIELD OF THE INVENTION

The present invention relates generally to electronic circuit boards and more particularly to a grid-like ground plane suitable for use in circuit boards and other types of electronic hardware for controlling signal trace impedances such as backplane or other interconnect plane impedances.

BACKGROUND OF THE INVENTION

Electronic circuit boards often include signal traces configured as transmission lines overlying a large conductive ground plane and separated from the ground plane by a dielectric material. The capacitance in farads and inductance in henries associated with a given signal trace may be computed from the following equations for capacitance and inductance of a parallel plate capacitor:

$$C = \epsilon_0 \epsilon_r A/h$$

$$L = 1.256 hl/w$$

in which $\epsilon_0$ is the permittivity of free space, $\epsilon_r$ is the relative permittivity of the dielectric material, A is the surface area of the signal trace corresponding to length l times width w, and h is the distance between the signal trace and the ground plane. The inductance in nanohenries of a flat conductor is given by the following equation:

$$L = 2 \times 10^{-3} l \left[ \ln \frac{l}{w+h} + 1.193 + 0.2235 \frac{w+h}{l} \right]$$

For a signal trace characterized as a transmission line, the values of C and L determined from the above equations can be expressed in per unit length terms by dividing by the total length of the transmission line. The characteristic impedance $Z_0$ of a transmission line in ohms is generally given by the following equation in which C and L are in per unit length terms:

$$Z_0 = \sqrt{\frac{L}{C}}$$

The following equation may be used to calculate the characteristic impedance $Z_0$ of a narrow signal trace over a large ground plane, where the w/h ratio is less than 3.3:

$$Z_0 = \frac{119.9}{\sqrt{2(\epsilon_r + 1)}} \left[ \ln \left( 4(h/w) + \sqrt{16(h/w) + \sqrt{16(h/w)^2 + 2}} \right) \right]$$

The above equation indicates that the characteristic impedance $Z_0$ of the signal trace can be changed by changing the relative permittivity $\epsilon_r$ of the dielectric material, the height h of the signal trace above the ground plane, and the width w of the signal trace. It is important to note that in the above equation, ground plane characteristics are apparently not factors which may be adjusted to alter the characteristic impedance $Z_0$ of the signal trace. The ground plane is instead generally assumed to have no loss and negligible inductance. However, this common assumption restricts the number of techniques available to adjust signal trace impedances on a circuit board. For example, it is often impractical and unduly costly to alter the dielectric material of a given circuit board to provide impedance adjustments for particular signal traces. In many applications, the width of a signal trace and its height above the ground plane are limited by design constraints such as total circuit board thickness and the number and relative spacing of signal traces. It is therefore very difficult in many practical applications to control signal trace impedances by adjusting signal trace width, height over the ground plane and dielectric characteristics on a circuit board using conventional design techniques. The use of such conventional techniques may unduly increase the size, cost and complexity of a given circuit board.

It is important to control signal trace impedance in an electronic circuit board in order to compensate loading effects of circuits or components connected to a given signal trace. In low frequency circuits operating below about 50 MHZ, high impedance signal traces are often used to compensate the loading effects of circuits. In microwave and other high frequency circuits, tapered line techniques may be used to control signal trace impedance. Examples of tapered line implementations may be found in Y. P. Tang and S. Y. Tang, "Transient Analysis of Tapered Lines Based on the Method of Series Expansion," IEEE Transactions on Microwave Theory and Techniques, Vol. 44, No. 10, October 1996, pp. 1742–1744, and Y. P. Tang, Z. Li and S. Y. Tang, "Transient Analysis of Tapered Transmission Lines Used as Transformers for Short Pulses," IEEE Transactions on Microwave Theory and Techniques, Vol. 43, No. 11, November 1995, pp. 2573–2578, both of which are incorporated by reference herein. Tapered lines are described in greater detail in Robert E. Collin, "Foundations for Microwave Engineering," McGraw-Hill, N.Y., 1966, pp. 237–251, which is incorporated by reference herein. Impedance control of a tapered line generally involves smoothly varying the trace width of the tapered line. This can create a number of problems in important applications. For example, in a circuit board backplane application in which multiple chip packages must be connected to a tapered line signal trace on a backplane, it may be necessary to provide different pin layouts and fixed board locations for each of the chip packages in order to connect properly to the tapered trace. Moreover, tapered trace lines usually do not provide a sufficiently high impedance because the trace impedance decreases with increasing trace width. The use of tapered line techniques is therefore impractical in many high frequency backplane signal trace impedance control applications.

Another conventional approach to controlling signal trace impedance involves the use of quarter-wave transformers to provide impedance matching, as described in Brian J. Minnis, "Designing Microwave Circuits by Exact Synthesis," Artech House, Boston, 1996, pp. 222–225 and 257–259. Other impedance matching approaches are described in Brian C. Wadell, "Transmission Line Design Handbook," Artech House, Boston, 1991, pp. 324–325 and Marek T. Faber et al., "Microwave and Millimeter-Wave Diode Frequency Multipliers," Artech House, Boston, 1995, pp. 110–113 and 338–340. However, these and other conventional techniques are not well suited for use in applications such as the above-described circuit board backplane or any other interconnect plane used to interconnect multiple chip packages. Moreover, these techniques often require substantial variations in signal trace dimensions and circuit board layout, thereby unduly complicating the circuit board design and manufacturing process, and increasing the size, cost and complexity of the board.

As is apparent from the above, a need exists for an improved technique for controlling signal trace impedances on a circuit board, such that the problems associated with adjustment of trace width, trace height above the ground plane, dielectric material or other circuit board parameters can be avoided.

SUMMARY OF THE INVENTION

The present invention provides methods and apparatus for controlling signal trace impedance in an electronic circuit board by adjusting the impedance of a grid-like ground plane or similar conductive plane.

In accordance with one aspect of the invention, a circuit board is provided which includes a signal trace plane and a ground plane. The ground plane is arranged adjacent and parallel to the signal trace plane and is separated from the signal trace plane by a dielectric material. At least a portion of the ground plane underlying a given signal trace of the signal trace plane has a grid-like pattern of conductors. The grid-like pattern of conductors forms grid elements which vary in size along at least a portion of a length of the signal trace to alter an impedance of the signal trace. For example, the grid elements vary in size along the length of the signal trace from a relatively small size providing a relatively low impedance for the signal trace to a larger size providing a higher impedance for the signal trace. The variation in grid element size along the signal trace may be in accordance with a ramp function, a staircase function, a square wave function, or in accordance with various combinations of these and other functions. Although the grid elements are preferably square, rectangular or circular in shape, a number of alternative shapes and various combinations thereof could also be used. The variation in grid element size may be provided by altering the pattern of conductors which form the grid elements, by altering characteristics of the conductors such as width and thickness, or by combinations of these and other techniques.

In accordance with another aspect of the invention, a method of adjusting the impedance of a signal trace on a circuit board is provided. The method includes the steps of arranging the signal trace to overlay a grid-like conductive ground plane of the circuit board, and adjusting the impedance of a portion of the ground plane below the signal trace in order to control the impedance of the signal trace. The grid-like ground plane includes a pattern of conductors forming grid elements. The ground plane impedance is adjusted by varying the size of the grid elements along a length of the signal trace. This variation may be used to provide a desired impedance on the signal trace. For example, in a backplane wiring application, it may be desirable to provide an increasing impedance along a signal trace in order to compensate for capacitive loading effects of integrated circuits having pins connected to the signal trace. Such an impedance may be provided in accordance with the present invention by varying the size of the ground plane grid elements from a relatively small size providing a low impedance at a source end of the signal trace to a larger size providing a higher impedance at a termination end of the signal trace. As previously noted, the grid size variation may be in accordance with a ramp function, a staircase function, a square wave function, as well as various combinations of these and other functions.

The present invention provides a cost-effective technique for controlling signal trace impedances on a circuit board by altering the characteristics of a grid-like ground plane, and may be used to provide a desired impedance for backplane or other interconnect plane signal traces without altering the signal traces, board thickness or dielectric material. The invention is also particularly well-suited for use in merging high impedance cables into a circuit board structure, and in numerous other impedance control applications. These and other features and advantages of the present invention will become more apparent from the accompanying drawings and the following detailed description.

DETAILED DESCRIPTION OF THE INVENTION

Figure 1A:
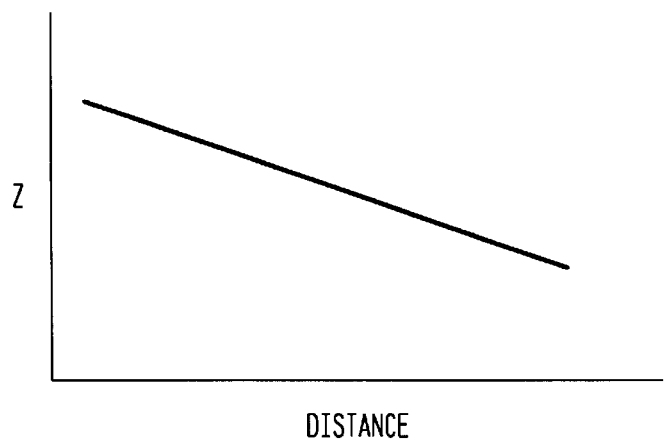
FIGS. 1A, 1B and 1C illustrate characteristic impedance variations of exemplary ground planes configured in accordance with the invention.

The present invention will be illustrated below in conjunction with exemplary electronic circuit boards, signal traces and ground planes. It should be understood, however, that the invention is not limited to use with any particular type of circuit board, signal trace or ground plane, but is instead more generally applicable to a wide variety of impedance control applications. For example, although the techniques are well-suited for providing backplane or other interconnect plane impedance control in multi-layer printed circuit boards and for merging cables or other wiring into a circuit board structure, the invention may also be utilized to control other types of impedances in other types of electronic hardware operating in a variety of different frequency ranges. The term "electronic circuit board" as used herein refers generally to any single layer or multi-layer device for supporting electronic circuitry, and is intended to include any printed circuit board, printed wiring board or other electronic hardware used for circuit or electronic component interconnection. The term "ground plane" should be understood to include not only conductive planes which in operation are coupled to ground potential, but also conductive planes which may be coupled to other circuit potentials. The terms "grid" and "grid-like" as used herein are intended to include not only the illustrative grids which are generally comprised of metallic mesh or netting having square or rectangular grid elements, but also grids formed of elements having a variety of other shapes, including circular shapes, as well as grids formed of various combinations of different shapes. The term "grid element" as used herein is intended to include metallic mesh or netting formed by conductors of different thicknesses, widths and lengths. The term "interconnect plane" as used herein is intended to include any backplane, midplane, side plane, front plane, mother board, daughter board or any other signal trace plane containing signal traces used to interconnect circuit elements. The terms "dielectric" and "dielectric material" as used herein refer to any type of dielectric or combination of different types of dielectrics, including an air dielectric, which may be used to separate a ground plane and a signal trace.

The present invention provides signal trace impedance control in a circuit board by altering the characteristic impedance of a grid-like ground plane separated from the ground plane by a dielectric. The inductance L of any conductor may be expressed as the ratio of the flux Φ produced by the conductor to the current I in the conductor. In general, the longer the current path, the higher the flux and therefore the higher the inductance. As noted above, a higher inductance results in a higher characteristic impedance. The grid-like ground plane structure of the present invention creates a longer current path by forcing return current to flow through conductors of a grid-like pattern in a zig-zag fashion. In accordance with the invention, the ground plane inductance is increased and the ground plane capacitance is decreased by increasing the size of grid elements formed by the conductors of the grid-like ground plane. The characteristic impedance of a signal trace over a given grid-like ground plane will therefore be greater than that of a signal trace over a solid ground plane for the same signal trace width, dielectric thickness, and conductive and dielectric materials. As will be described in greater detail below, the characteristic impedance of the signal trace can be adjusted by altering the size of the grid elements in the grid-like pattern of the ground plane. The size variation of the grid elements may be provided by altering the manner in a given set of conductors are formed into the grid-like pattern, or by altering other ground plane characteristics such as thickness and width of the conductors.

Figure 1B:
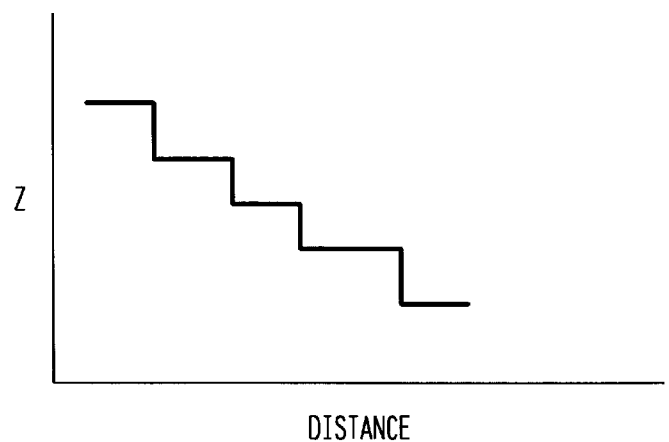
Figure 1C:
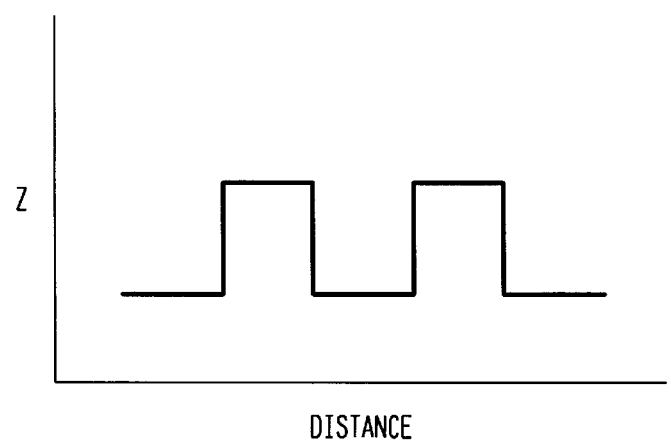

FIGS. 1A, 1B and 1C show exemplary impedance variations which may be created by altering grid element size in a grid-like ground plane in accordance with the invention. FIG. 1A shows an impedance variation in which a high impedance is provided at one end of a signal trace and a lower impedance at the other end of the signal trace. Along the length of the signal trace, the impedance varies in accordance with a ramp function. Such an impedance variation could be provided by varying the size of the ground plane grid elements from a larger size to a smaller size in a substantially continuous manner for a portion of the ground plane underlying the trace. The portion of the signal trace above the larger grid elements will exhibit a larger impedance, and the portion above the smaller grid elements or a solid portion of the ground plane will exhibit a smaller impedance. The impedance variation of FIG. 1A is particularly well-suited for compensating capacitive loading effects along a bus with large groups of parallel connections which are uniformly spaced at relatively small distances, as will be described in conjunction with FIGS. 2A and 2B below.

FIG. 1B also shows an impedance variation in which a high impedance is provided at one end of a signal trace and a lower impedance at the other end of the signal trace, but in which the impedance varies in accordance with a staircase function along the length of the signal trace. Such an impedance variation is particularly well-suited for compensating capacitive loading effects along a bus with large groups of parallel connections which are non-uniformly spaced at relatively large distances, as will be described in conjunction with FIGS. 4A and 4B below. FIG. 1C shows an impedance variation which varies in accordance with a square wave function along the length of the signal trace. Such an impedance variation may be provided by alternately increasing and decreasing the size of the grid elements along the length of the signal trace, and is particularly well-suited for compensating the capacitive loading effects of a chip or other circuit element at a connection point. It should be noted that various combinations of the impedance variation functions of FIGS. 1A, 1B and 1C may be used in a given application, as well as numerous other types of functions and combinations thereof.

Figure 2A:
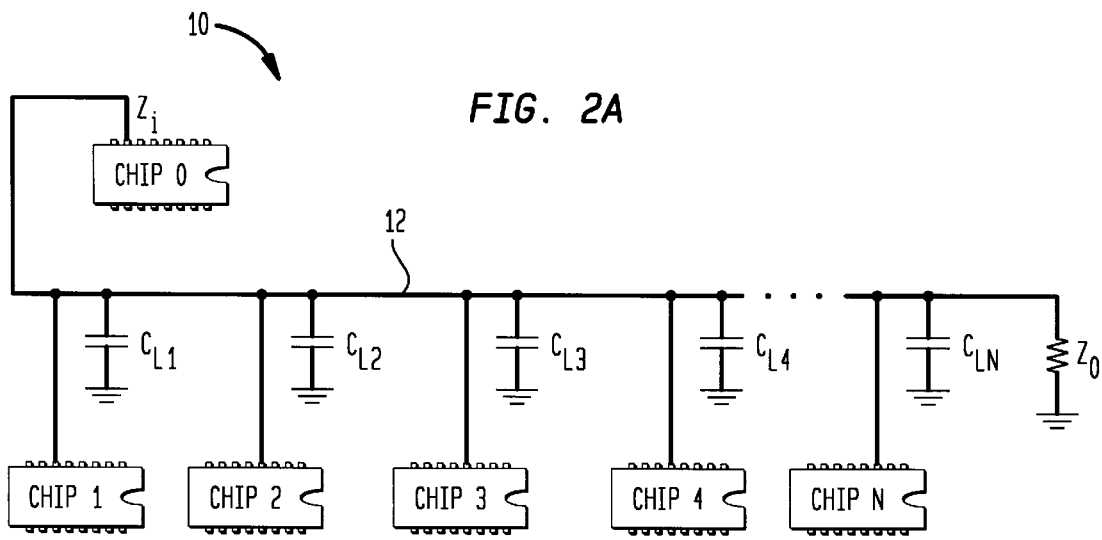
FIGS. 2A and 2B illustrate circuit board wiring applications in which a ground plane in accordance with the invention may be utilized for signal trace impedance control.
Figure 2B:
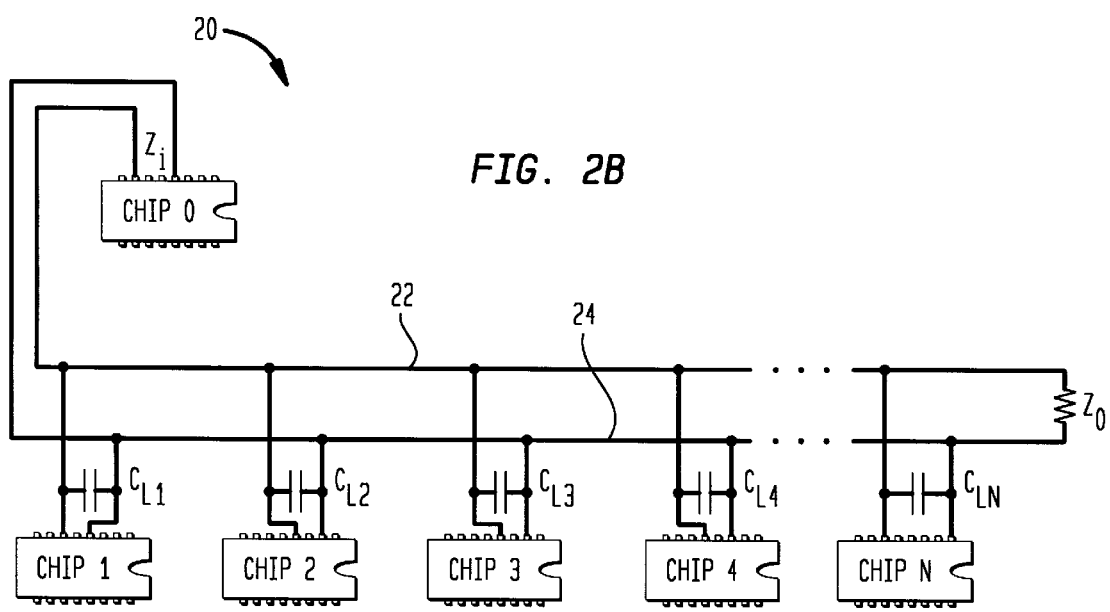

FIGS. 2A and 2B illustrate exemplary signal trace impedance control applications of the present invention. FIG. 2A shows a portion 10 of a circuit board including a group of N separate integrated circuits designated CHIP 0, CHIP 1, CHIP 2 . . . CHIP N. Various pins of the integrated circuits are connected to a signal trace 12 which represents an unbalanced transmission line having a source impedance Zi and terminated by an impedance $Z_0$. The N circuits introduce N parallel capacitive loads $C_{L1}, C_{L2} \ldots C_{LN}$ on the signal line 12. These capacitive loads alter the characteristic impedance of the signal trace 12. FIG. 2B shows another portion 20 of a circuit board in which the N integrated circuits are connected to signal traces 22 and 24 which together represent a balanced transmission line having a source impedance Zi and terminated by an impedance $Z_0$. The N circuits in FIG. 2B introduce N parallel capacitive loads $C_{L1}, C_{L2} \ldots C_{LN}$ between the signal traces 22 and 24. If the number of circuits N is large in FIGS. 2A and 2B, the circuits connected near the termination end of a given trace may receive insufficient signal strength. Moreover, signal reflections can alter the signal levels present at a given circuit pin, leading to serious operational problems for level-sensitive digital circuitry. The severity of these effects generally increases with signal frequency, and it is therefore undesirable to connect multiple chips to a given high frequency signal trace absent some type of impedance control to compensate for the capacitive loading of the N circuits. As previously noted, conventional techniques for providing such impedance control typically involve alteration of the signal trace structure and layout, and are therefore inefficient and unduly increase the size, cost and complexity of the circuit board. The present invention provides a more cost-effective solution by altering the characteristics of a grid-like ground plane in order to adjust the signal trace impedance.

Figure 3:
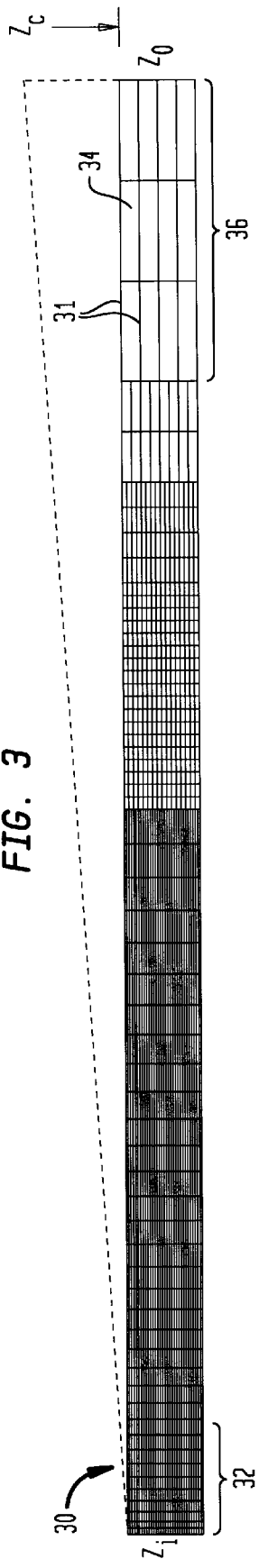
FIG. 3 shows a grid-like ground plane in accordance with the invention in which grid element size varies as a ramp function along the length of a signal trace.

FIG. 3 shows an exemplary grid-like ground plane 30 which may be used to provide impedance control along the signal traces of FIGS. 2A and 2B. In this embodiment, the ground plane 30 is formed of a grid-like pattern of conductors 31. The size of the grid elements formed by the pattern of conductors 31 increases along the length of the signal traces 12, 22 or 24 of FIGS. 2A and 2B, to thereby alter the characteristic impedance along a given trace in the manner shown in FIG. 3. This impedance variation follows a ramp function which is the inverse of that illustrated in FIG. 1A. The trace impedance increases from a low initial source impedance value Zi to a higher impedance value Zc at the termination of the trace. The value of Zc is greater than the unloaded characteristic impedance $Z_0$ of the signal trace. The grid elements formed by the pattern of ground plane conductors 31 are relatively small in a portion 32 of the ground plane 30 to provide the initial impedance Zi, and increase in accordance with a ramp function along the length of the signal trace. The grid elements 34 in a portion 36 of the ground plane 30 near the termination of the signal trace are relatively large, to provide the higher termination Zc required to properly compensate the capacitive loading effects of the circuits connected to the signal trace. The grid-like ground plane 30 of the present invention thus compensates for capacitive loading effects in the circuit boards of FIGS. 2A and 2B without requiring any alteration of signal trace parameters.

Figure 4A:
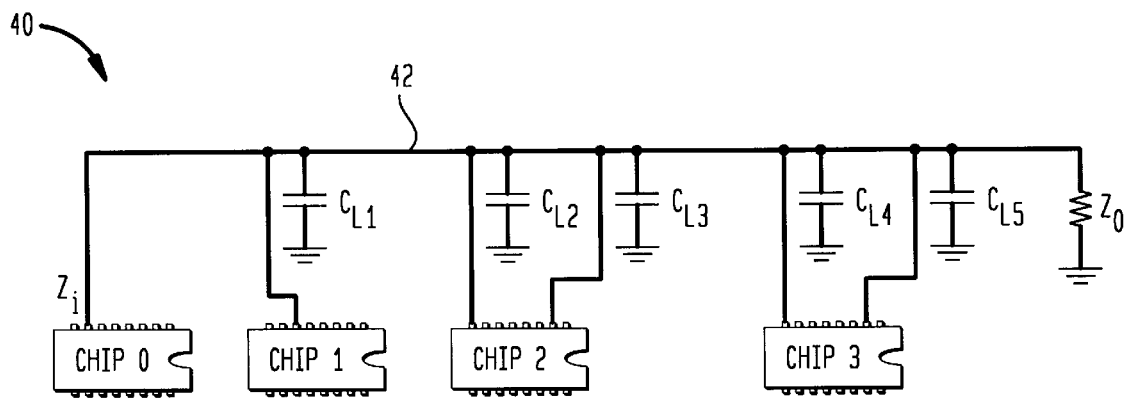
FIGS. 4A and 4B illustrate other circuit board wiring applications in which a ground plane in accordance with the invention may be utilized for signal trace impedance control.
Figure 4B:
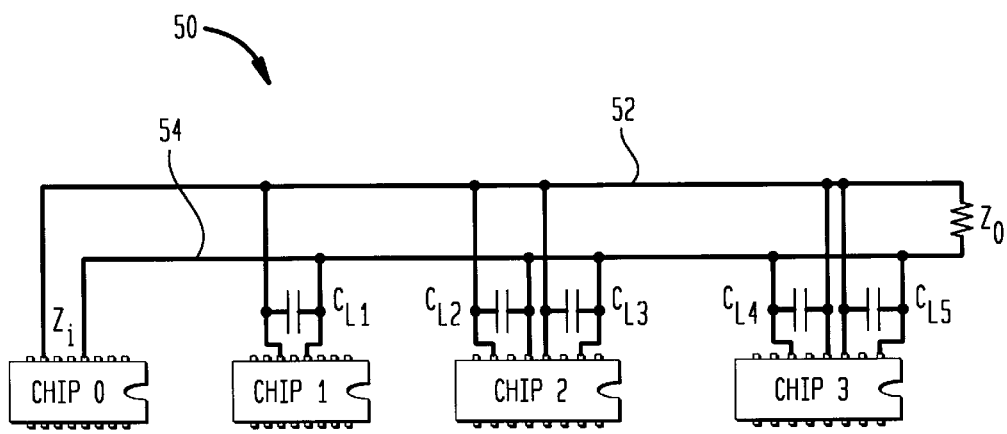

FIGS. 4A and 4B illustrate additional exemplary signal trace impedance control applications of the present invention. FIG. 4A shows a portion 40 of a circuit board including a group of four separate integrated circuits designated CHIP 0, CHIP 1, CHIP 2 and CHIP 3. Various pins of the integrated circuits are connected to a signal trace 42 which represents an unbalanced transmission line having a source impedance Zi and terminated by an unloaded characteristic impedance $Z_0$ of the signal trace. The four circuits introduce five parallel capacitive loads $C_{L1}, C_{L2} \ldots C_{L5}$ on the signal line 42. As in the FIGS. 2A and 2B illustrations, these capacitive loads alter the impedance of the signal trace 42. However, the circuits in FIG. 4A include relatively few connections to the trace 42, and the connections are unequally spaced. FIG. 4B shows another portion 50 of a circuit board in which the four integrated circuits are connected to signal traces 52 and 54 which together represent a balanced transmission line having a source impedance Zi and terminated by an impedance $Z_0$. The four circuits in FIG. 4B introduce five parallel capacitive loads $C_{L1}, C_{L2} \ldots C_{L5}$ between the signal traces 52 and 54. The capacitive loading in FIGS. 4A and 4B alters the signal trace impedance, and can result in undesirable variation in signal levels along the traces 42, 52 and 54.

Figure 5:
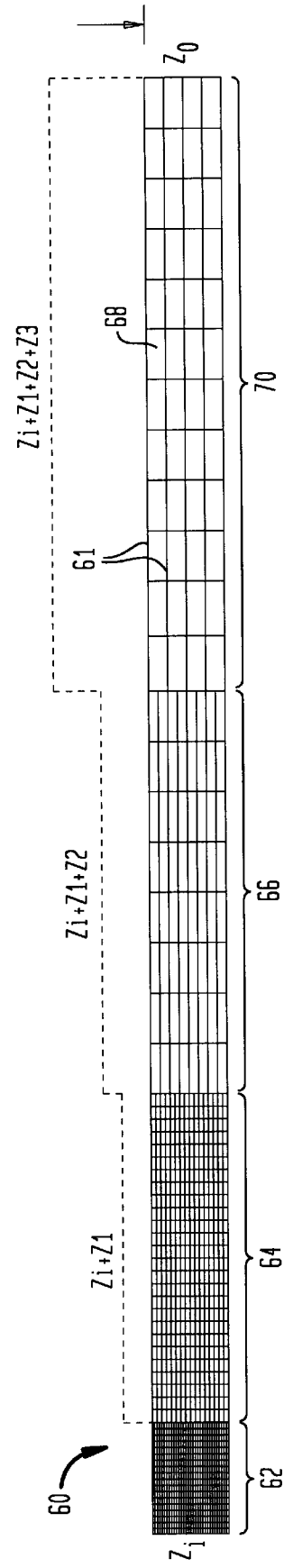
FIG. 5 shows a grid-like ground plane in accordance with the invention in which grid element size varies as a staircase function along the length of a signal trace.

FIG. 5 shows an exemplary grid-like ground plane 60 which may be used to provide impedance control along the signal traces of FIGS. 4A and 4B to compensate for capacitive loading. Like the ground plane 30 of FIG. 3, the ground plane 60 is formed of a grid-like pattern of conductors 61. The size of the grid elements formed by the pattern of conductors 61 increases along the length of the signal traces 42, 52 or 54 of FIGS. 4A and 4B, to thereby alter the characteristic impedance along a given trace in the manner shown in FIG. 5. This impedance variation follows a staircase function which is similar to that illustrated in FIG. 1B. The trace impedance increases from a low initial source impedance value Zi to a higher impedance value Zi+Z1+Z2+Z3 at the termination of the trace. The value of Zi+Z1+Z2+Z3 is greater than the unloaded characteristic impedance $Z_0$ of the signal trace. The grid elements formed by the pattern of ground plane conductors 61 are relatively small in a portion 62 of the ground plane 60 to provide the initial impedance Zi, and increase in portions 64, 66 and 70 in accordance with the staircase function. The grid elements 68 in portion 70 of the ground plane 60 near the termination of the signal trace are relatively large, to provide the higher termination impedance Zi+Z1+Z2+Z3 required to properly compensate the capacitive loading effects of the circuits connected to the signal trace. The grid-like ground plane 60 of FIG. 5 thus compensates for capacitive loading effects in the circuit boards of FIGS. 4A and 4B without requiring any alteration of signal trace or dielectric material parameters.

Figure 6:
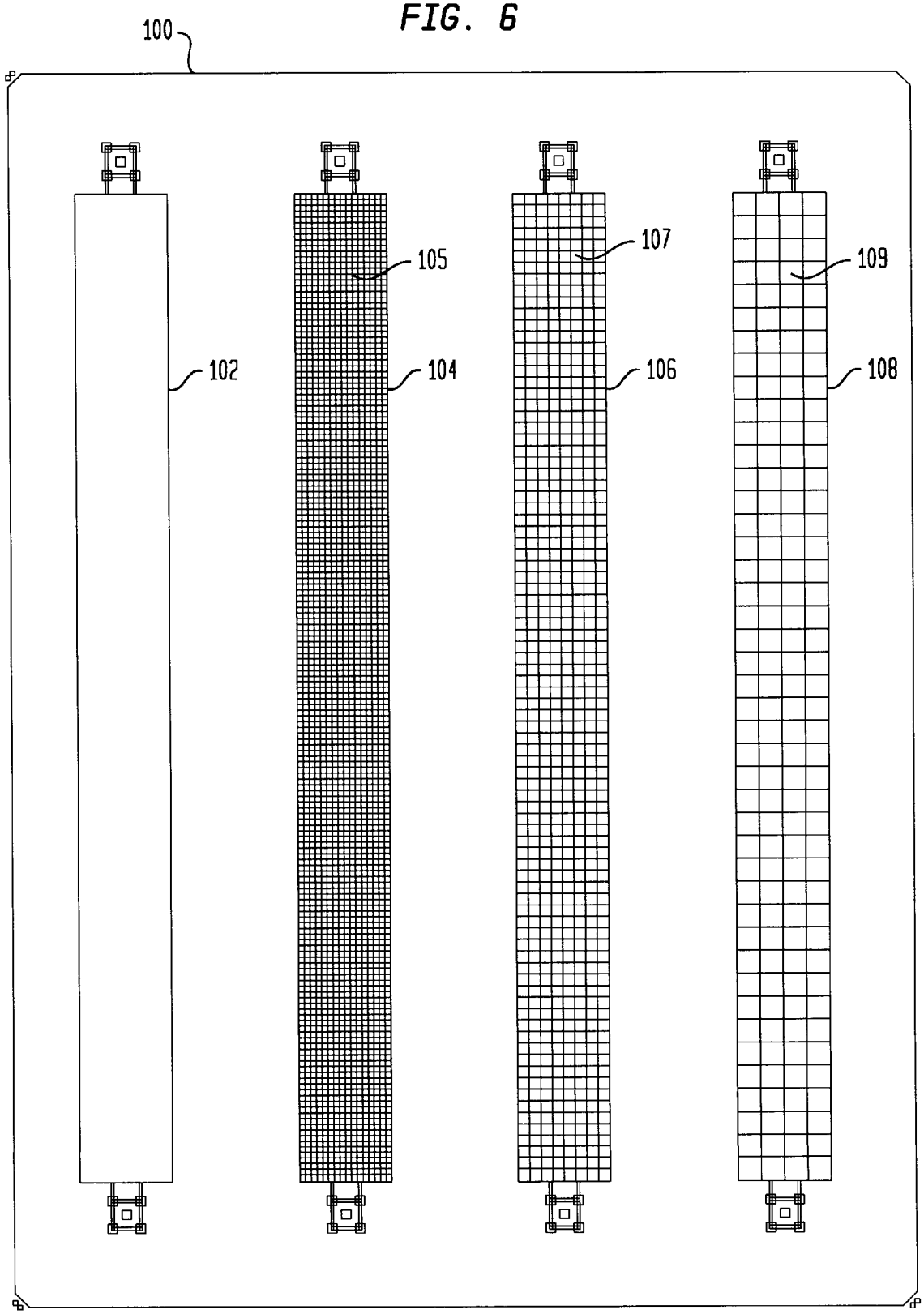
FIG. 6 illustrates an exemplary set of grid-like ground planes formed in accordance with the invention on a single circuit board layer.
Figure 7:
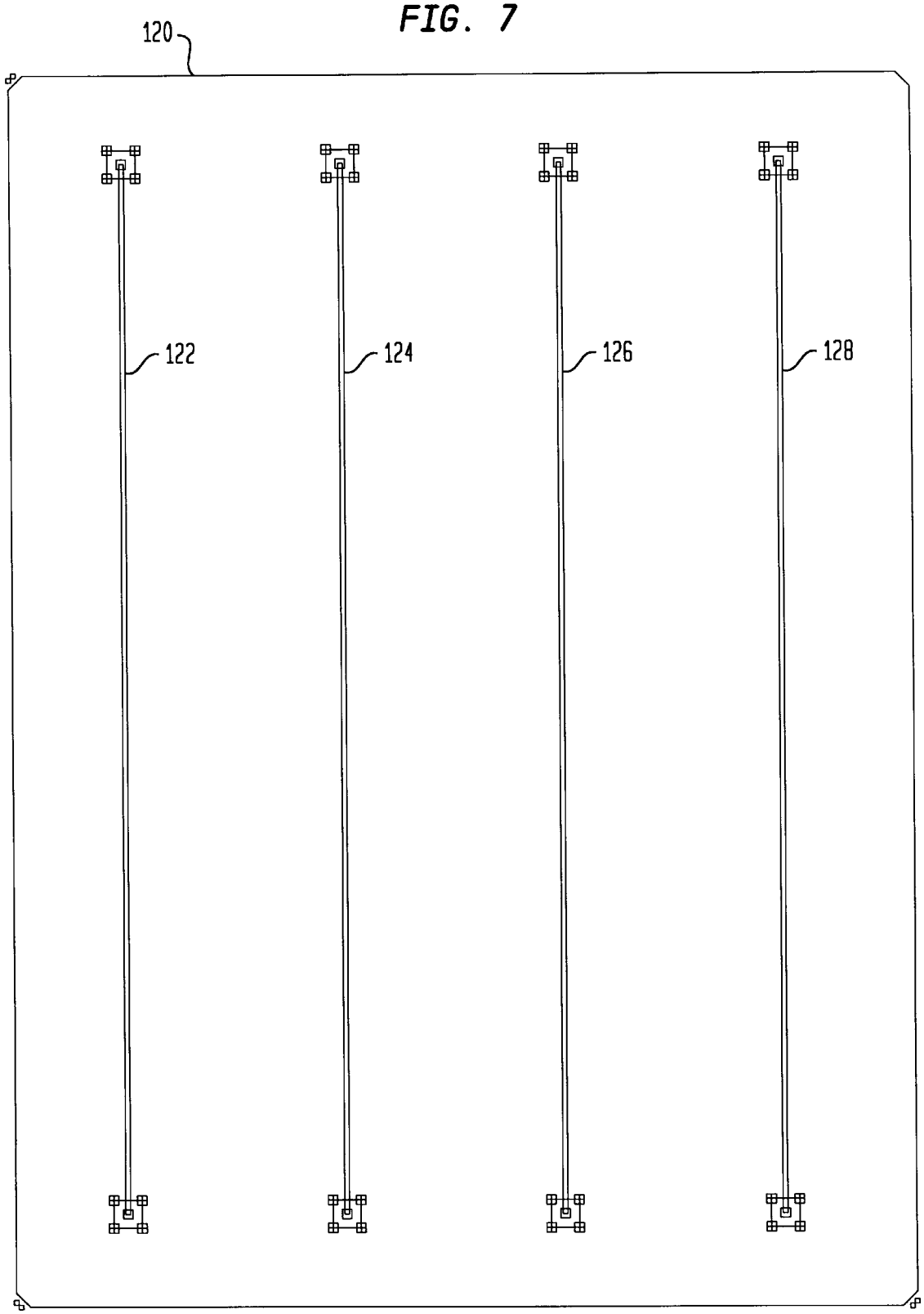
FIG. 7 illustrates an exemplary set of signal traces formed on a single circuit board layer and suitable for use with the ground planes of FIG. 6.

FIG. 6 shows an exemplary ground plane layer 100 of a two-layer printed circuit board configured to illustrate the operation of the present invention. The ground plane layer 100 includes four different types of ground planes 102, 104, 106 and 108. The first ground plane 102 is a solid ground plane typically used in conventional circuit boards. The second ground plane 104 is a grid-like ground plane having a pattern of conductors which form square grid elements 105 of about 50×50 mils (1.27×1.27 mm). The third and fourth ground planes 106 and 108 are also grid-like ground planes, but with square grid elements 107, 109 of about 100×100 mils (2.54×2.54 mm) and about 200×200 mils (5.08×5.08 mm), respectively. FIG. 7 shows a corresponding signal trace layer 120 of the printed circuit board. The signal trace layer 120 may be arranged adjacent and parallel to the ground plane layer 100 of FIG. 6, and separated therefrom by a suitable dielectric material to form a two-layer circuit board. The signal trace layer 120 includes four signal traces 122, 124, 126 and 128, each of which is associated with a corresponding one of the ground planes 102, 104, 106 and 108 of the ground plane layer 100 of FIG. 6. Each of the signal traces of trace layer 120 is about 30 mils (0.762 mm) wide, and about 23 cm in length. All of the traces are unbalanced traces, such that the return current flows through the corresponding ground plane. Propagation delay and characteristic impedance $Z_0$ were measured for each of the signal traces of layer 120 in a two-layer board including the layer 120 overlying the ground plane layer 100. The layers 100, 120 were separated by a 62 mil (1.575 mm) thick FR-4 dielectric material having a dielectric constant of about 4.6. The grid elements of the ground plane layer 100 were formed using 4 mil (0.1016 mm) wide, 1.4 mil (0.0356 mm) thick copper conductors. The measurement results are summarized in Table 1 below.

TABLE 1

| Trace Width (mils) | 30 | 30 | 30 | 30 |
|---|---|---|---|---|
| Grid Element Size (mils) | 200 × 200 | 100 × 100 | 50 × 50 | 0 |
| Propagation Delay (ns) | 1.22 | 1.22 | 1.22 | 1.22 |
| $Z_0$ (ohms) | 118 | 110 | 99 | 90 |

It can be seen from Table 1 that the propagation delay for each signal trace of layer 120 is substantially unchanged. The characteristic impedance $Z_0$, however, varies as a function of grid element size. The characteristic impedance of the signal trace 122 overlying the solid ground plane 102 is about 90 ohms, while the impedances of the traces 124, 126 and 128 overlying the ground planes 104, 106 and 108 are about 99 ohms, 110 ohms and 118 ohms, respectively. The alteration of the ground plane from a conventional solid configuration to a grid-like configuration with grid elements of about 200×200 mils (5.08×5.08 mm) thus increases the characteristic impedance of a given signal trace by about 28 ohms, without requiring any alteration in the signal trace or board dielectric.

Figure 8:
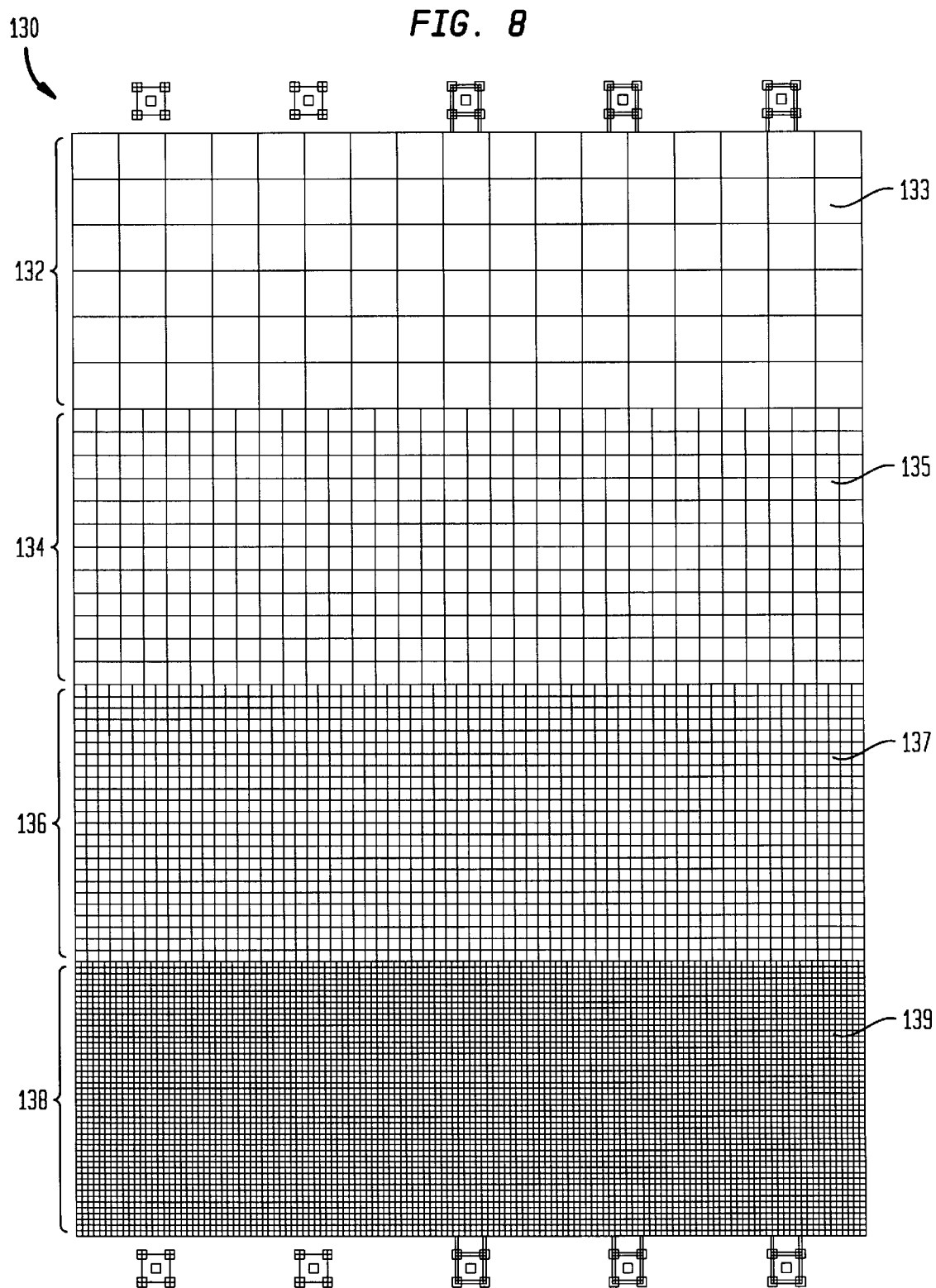
FIG. 8 illustrates an exemplary grid-like ground plane formed in accordance with the invention on a single circuit board layer.
Figure 9:
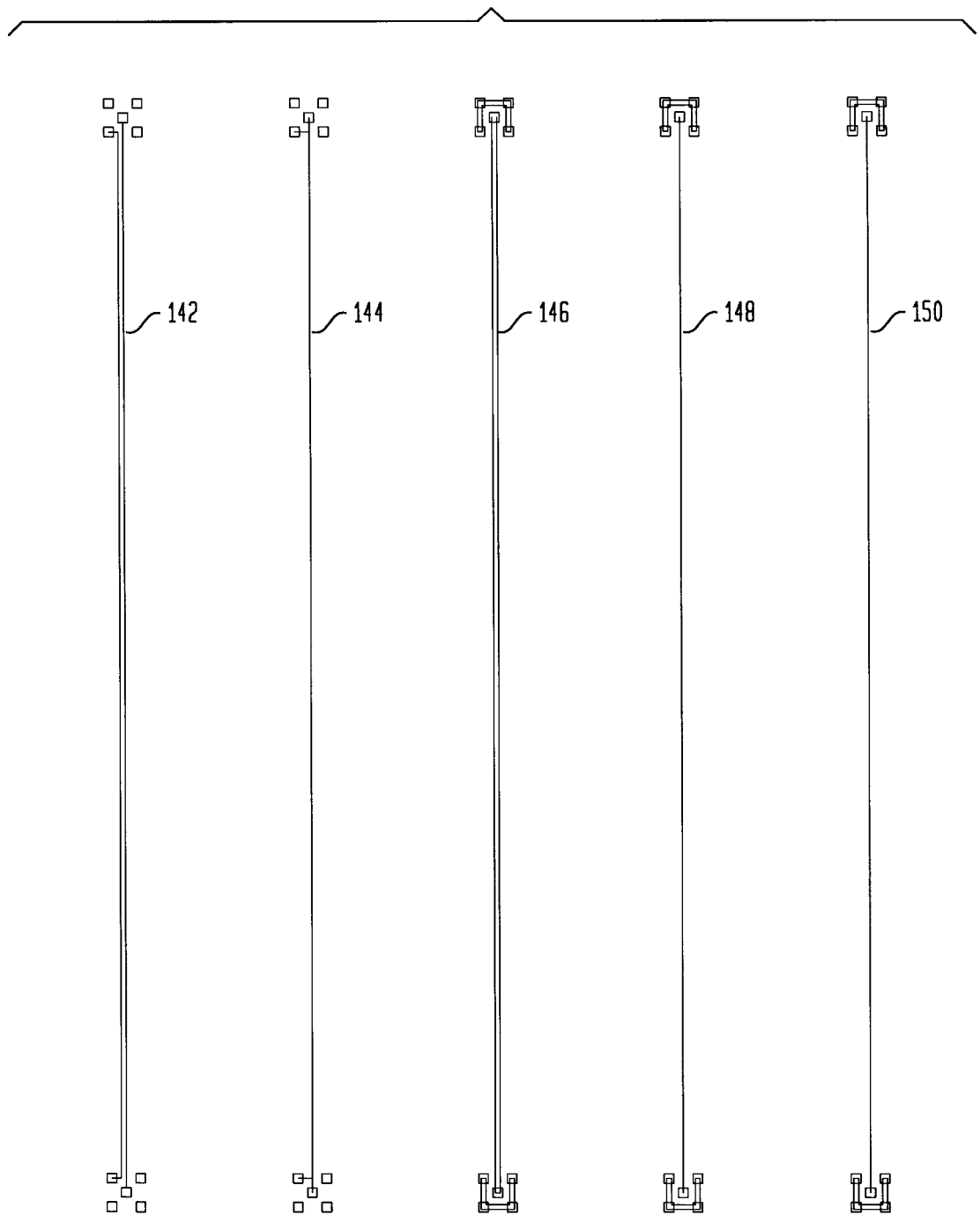
FIG. 9 illustrates an exemplary set of signal traces formed on a single circuit board layer and suitable for use with the ground plane of FIG. 8.

FIG. 8 shows an exemplary ground plane layer 130 of a two-layer printed circuit board configured to provide further illustration of the operation of the present invention. The ground plane layer 130 includes a single ground plane having four distinct regions 132, 134, 136 and 138 with each region having a different grid element size. The grid elements 133, 135, 137 and 139 of the regions 132, 134, 136 and 138 are about 50×50 mils (1.27×1.27 mm), 100×100 mils (2.54×2.54 mm), 200×200 mils (5.08×5.08 mm) and 400×400 mils (10.16×10.16 mm), respectively. FIG. 9 shows a corresponding signal trace layer 140 of the printed circuit board. The signal trace layer 140 may be arranged adjacent and parallel to the ground plane layer 130 of FIG. 8, and separated therefrom by a suitable dielectric material to form a two-layer circuit board. The exemplary signal trace layer 140 includes five signal traces 142, 144, 146, 148 and 150, each of which will overlay a corresponding portion of the ground plane of FIG. 8. The grid element size in a portion of the ground plane below a given signal trace will therefore vary along the length of the signal trace in accordance with a staircase function from a smaller grid size providing a lower impedance to a larger grid size providing a higher impedance.

The signal traces 146, 148 and 150 of layer 140 are unbalanced traces having widths of 20 mils (0.508 mm), 10 mils (0.254 mm) and 8 mils (0.203 mm), respectively. As noted previously, return current flows through the ground plane in the case of an unbalanced trace. The traces 142 and 144 are balanced traces which include first and second conductors each having a width of 8 mils (0.203 mm). In the case of balanced traces, return current flows through one of the traces instead of through the ground plane. The separation between conductors associated with trace 142 and 144 is 20 mils (0.508 mm) and 10 mils (0.254 mm), respectively. The balanced traces 142 and 144 will therefore be referred to as 8/20/8 and 8/10/8 traces, respectively. Each of the signal traces of trace layer 140 is about 22.5 cm in length. Propagation delay and characteristic impedance $Z_0$ were measured for several of the signal traces of layer 140 in a two-layer board including the layer 140 overlying the ground plane layer 130. Again, a 62 mil (1.575 mm) thick FR-4 dielectric material having a dielectric constant of about 4.6 was used, and the grid elements were formed by 4 mil (0.1016 mm) wide, 1.4 mil (0.0356 mm) thick copper conductors. The measurement results are summarized in Table 2 below.

variations in the grid element size of ground plane 130 along the length of a given signal trace may be used to control the impedance of the trace without altering the trace itself, the board dielectric or any other circuit board parameter.

Figure 10:
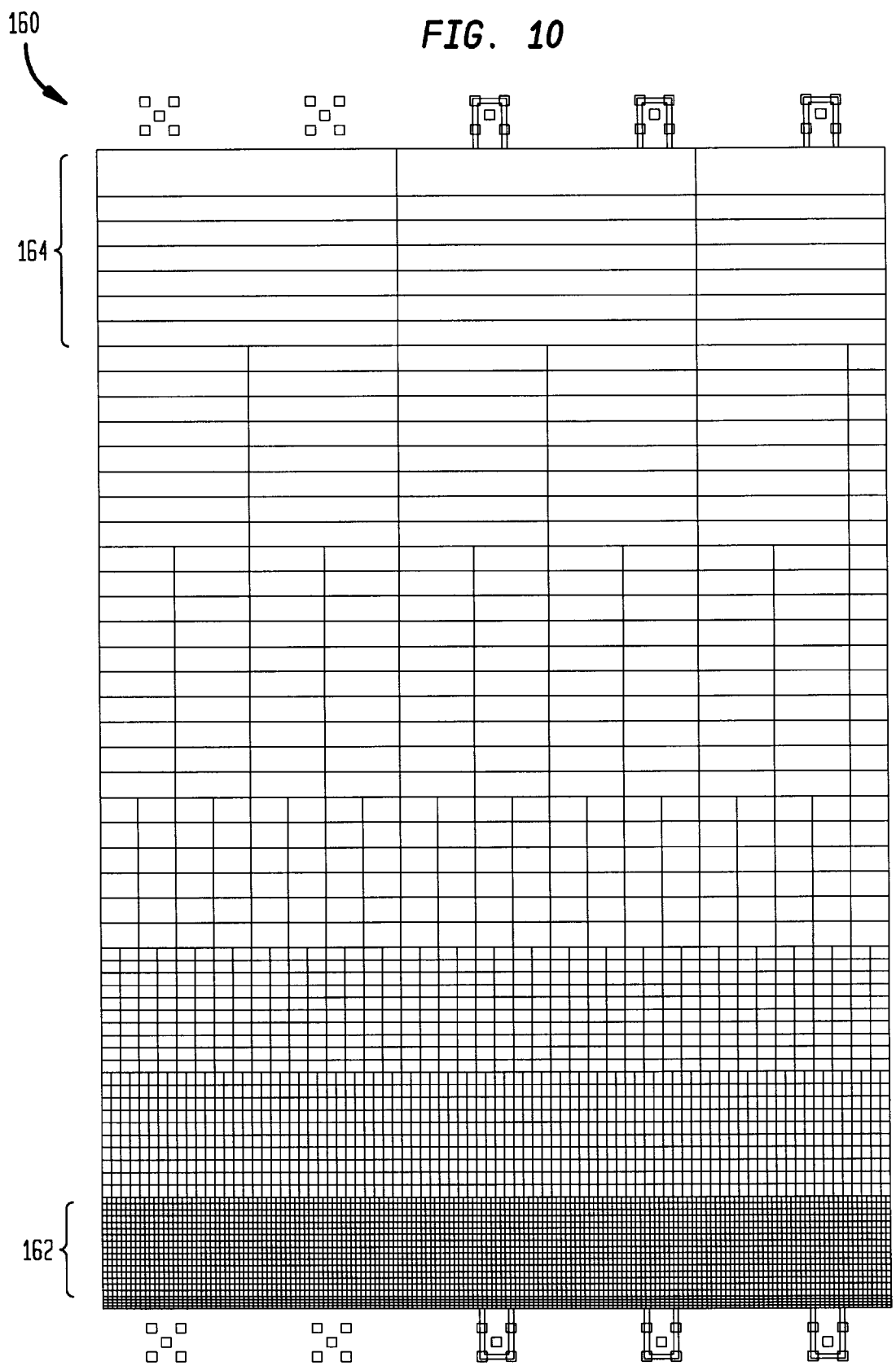
FIG. 10 illustrates another exemplary grid-like ground plane formed on a single circuit board layer and suitable for use with the signal traces of FIG. 9.

FIG. 10 shows another exemplary ground plane layer 160 in accordance with the present invention. The ground plane layer 160 includes a ground plane configured to provide a substantially continuous increase in grid element size from a first region 162 having relatively small grid element sizes to a second region 164 having relatively large grid element sizes. The smallest grid element in the ground plane of FIG. 10 is about 20×20 mils (0.508×0.508 mm), and one side of the smallest row of grid elements is increased by about 5 mils (0.127 mm) after every two rows of grid elements up to a size of about 215 mils (0.546 cm), followed by a final grid element in which the one side is about 400 mils (1.016 cm). The other side of the smallest row of grid elements is doubled after about 800 mils (2.03 cm), 1100 mils (2.79 cm), 1100 mils (2.79 cm), 1350 mils (3.43 cm), 2100 mils (5.33 cm), 1700 mils (4.32 cm) and 1650 mils (4.19 cm). The grid element size thus varies from about 20×20 mils (0.508×0.508 mm) to 2560×400 mils (6.50×1.016 cm) over the length of the ground plane to produce the grid-like pattern

TABLE 2

| Trace Width (mils) | 8 | 10 | 20 | 8/10/8 | 8/20/8 |
|---|---|---|---|---|---|
| Trace Characteristics | Unbalanced | Unbalanced | Unbalanced | Balanced | Balanced |
| Grid Element Size (mils) | 50 × 50 | 50 × 50 | 50 × 50 | 50 × 50 | 50 × 50 |
| | 100 × 100 | 100 × 100 | 100 × 100 | 100 × 100 | 100 × 100 |
| | 200 × 200 | 200 × 200 | 200 × 200 | 200 × 200 | 200 × 200 |
| | 400 × 400 | 400 × 400 | 400 × 400 | 400 × 400 | 400 × 400 |
| Propagation Delay (ns) | 2 | 2 | 2 | 1.3 | 1.6 |
| $Z_0$ (ohms) | 190 to 195 | 185 to 138 | 163 to 113 | 149 to 130 | 168 to 145 |

It can be seen from Table 2 that the propagation delays for the unbalanced traces 150, 148 and 146 are substantially constant, while the delays for the 8/10/8 and 8/20/8 balanced traces 144 and 142 are somewhat smaller. The characteristic impedance $Z_0$ along the length of each of the traces varies as a function of the grid element size. For example, the characteristic impedance of the 8/20/8 balanced signal trace 142 varies from 168 ohms for the end of trace 142 which overlies portion 132 of the ground plane 130, to 145 ohms for the other end of trace 142 overlying portion 138 of the ground plane 130. The impedance of the 8/10/8 balanced trace 144 varies from 149 ohms for the end of trace 144 which overlies portion 132 of the ground plane 130, to 130 ohms for the other end of trace 144 overlying portion 138 of the ground plane 130. Similarly, the impedances of the 20 mil (0.508 mm), 10 mil (0.254 mm) and 8 mil (0.203 mm) unbalanced traces 146, 148 and 150 vary from 163 to 113 ohms, 185 to 138 ohms and 190 to 145 ohms, respectively, along the length of the traces. It is apparent from Table 2 that shown in FIG. 10. This grid-like conductive plane was used as a ground plane in a four-layer circuit board.

The four-layer board included a first layer with the grid-like ground plane of FIG. 10, a second layer corresponding to the signal trace layer 140 of FIG. 9, a third layer also having the grid-like ground plane of FIG. 10, and a fourth layer with a conventional solid ground plane. A 20 mil (0.508 mm) thick FR-4 dielectric material having a dielectric constant of about 4.6 was used between the first and second layers, the second and third layers and the third and fourth layers. The grid elements of the grid-like ground plane were formed using 6 mil (15.2 mm) wide, 2.8 mil (0.0711 mm) thick copper conductors. Propagation delay and characteristic impedance $Z_0$ were measured for several of the signal traces of layer 140 in the four-layer board. The measurement results are summarized in Table 3 below.

TABLE 3

| Trace Width (mils) | 8 | 10 | 20 | 8/10/8 | 8/20/8 |
|---|---|---|---|---|---|
| Trace Characteristics | Unbalanced | Unbalanced | Unbalanced | Balanced | Balanced |
| Grid Element Size (mils) | Variable 20 × 20 to 2560 × 400 | Variable 20 × 20 to 2560 × 400 | Variable 20 × 20 to 2560 × 400 | Variable 20 × 20 to 2560 × 400 | Variable 20 × 20 to 2560 × 400 |
| Propagation Delay (ns) | 3.3 | 3.1 | 3.3 | 2.9 | 2.9 |
| $Z_0$ (ohms) | 130 to 77.4 | 120 to 66.4 | 94 to 53.7 | 99.4 to 74.3 | 130 to 98 |

The measurements of Table 3 indicate that the characteristic impedance $Z_0$ of the 8/20/8 balanced signal trace 142 in the four-layer board varies from 130 ohms for the end of trace 142 which overlies portion 164 of the ground plane 160, to 98 ohms for the other end of trace 142 overlying portion 162 of the ground plane 160. The impedance of the 8/10/8 balanced signal trace 144 in the four-layer board varies from 99.4 ohms for the end of trace 144 which overlies portion 164 of the ground plane 160, to 74.3 ohms for the other end of trace 144 overlying portion 162 of the ground plane 160. Similarly, the impedances of the 20 mil (0.508 mm), 10 mil (0.254 mm) and 8 mil (0.203 mm) unbalanced traces 146, 148 and 150 vary from 94 to 53.7 ohms, 120 to 66.4 ohms and 130 to 77.4 ohms, respectively, along the length of the traces. These measurements make it clear that the present invention is well-suited for controlling signal trace impedance in multi-layer circuit boards.

Although the above illustrative embodiments altered grid element size along the length of a signal trace while keeping the grid conductor width and thickness substantially constant, other embodiments may alter grid element size by changing the conductor width and/or thickness along the length of a signal trace. As noted above, the term "grid element" as used herein is intended to include metallic mesh or netting formed by conductors of different widths and thicknesses as well as different lengths. A variation in grid element size may therefore be obtained in accordance with the invention by altering the width and/or thickness of the conductors making up a given grid-like ground plane. The impedance of the grid-like ground plane generally increases with a decrease in grid conductor width or thickness. For example, a given grid-like ground plane formed in accordance with the invention using 1.4 mil (0.0356 mm) thick copper conductors will generally provide a higher impedance than the same grid-like ground plane formed using 2.8 mil (0.0711 mm) thick copper conductors.

The above-described embodiments of the invention are intended to be illustrative only. Numerous alternative embodiments may be devised by those skilled in the art without departing from the scope of the following claims.

What is claimed is:

1. A circuit board comprising:
   a signal trace plane; and
   a conductive plane arranged substantially parallel to the signal trace plane and separated therefrom by a dielectric material, wherein a portion of the conductive plane corresponding to a signal trace of the signal trace plane has a grid-like pattern of conductors forming grid elements which vary in size along at least a portion of a length of the signal trace to provide a signal trace impedance which varies along the length of the signal trace in accordance with a predetermined function.

2. The circuit board of claim 1 wherein the conductive plane comprises a ground plane.

3. The circuit board of claim 1 wherein the grid elements vary in size along the length of the signal trace from a first size providing a first impedance for the signal trace to a larger size providing a higher impedance for the signal trace.

4. The circuit board of claim 1 wherein the conductors of the grid-like pattern of conductors vary in at least one of width and thickness along the length of the signal trace such that the grid elements vary in size along the length of the signal trace.

5. The circuit board of claim 1 wherein the grid elements of the conductive plane vary in size such that the signal trace impedance varies in accordance with a ramp function along the length of the signal trace.

6. The circuit board of claim 1 wherein the grid elements of the conductive plane vary in size such that the signal trace impedance varies in accordance with a staircase function along the length of the signal trace.

7. The circuit board of claim 1 wherein the grid elements of the conductive plane vary in size such that the signal trace impedance varies in accordance with a square wave function along the length of the signal trace.

8. The circuit board of claim 1 wherein the predetermined function is selected to compensate for capacitive loading on the signal trace.

9. A method of controlling an impedance of a signal trace on a circuit board including a conductive plane separated from a plane of the signal trace by a dielectric material, the method comprising the steps of:
   arranging the signal trace to overlay a portion of the conductive plane; and
   adjusting an impedance of a portion of the conductive plane below the signal trace in order to provide a signal trace impedance which varies along the length of the signal trace in accordance with a predetermined function.

10. The method of claim 9 wherein the conductive plane is a ground plane.

11. The method of claim 9 wherein the portion of the conductive plane is arranged in a grid-like pattern of conductors and the step of adjusting an impedance of the conductive plane to control the impedance of the signal trace further includes the step of adjusting the size of grid elements formed by the grid-like pattern of conductors.

12. The method of claim 11 wherein the step of adjusting the size of the grid elements further includes adjusting the size of the grid elements such that the grid elements vary in size along a length of the signal trace from a first size providing a first impedance for the signal trace to a larger size providing a higher impedance for the signal trace.

13. The method of claim 11 wherein the step of adjusting the size of the grid elements further includes adjusting at least one of the width and thickness of the conductors forming the grid elements such that the grid elements vary in size along a length of the signal trace.

14. The method of claim 11 wherein the step of adjusting the size of the grid elements to control the signal trace impedance further includes the step of adjusting the size of the grid elements such that the signal trace impedance varies in accordance with a ramp function.

15. The method of claim 11 wherein the step of adjusting the size of the grid elements to control the signal trace impedance further includes the step of adjusting the size of the grid elements such that the signal trace impedance varies in accordance with a staircase function.

16. The method of claim 11 wherein the step of adjusting the size of the grid elements to control the signal trace impedance further includes the step of adjusting the size of the grid elements such that the signal trace impedance varies in accordance with a square wave function.

17. The method of claim 9 wherein the adjusting step further includes the step of selecting the predetermined function to compensate for capacitive loading on the signal trace.

18. A conductive plane for use in an electronic circuit board including a signal trace, the conductive plane comprising:
   a grid-like pattern of conductors arranged adjacent and parallel to a signal trace plane of the circuit board and separated from the signal trace plane by a dielectric material, the grid-like pattern of conductors forming grid elements varying in size along at least a portion of a length of the signal trace to provide a signal trace impedance which varies along the length of the signal trace in accordance with a predetermined function.

19. The conductive plane of claim 18 wherein the conductive plane serves as a ground plane in the circuit board.

20. The conductive plane of claim 18 wherein the grid elements vary in size along the length of the signal trace from a first size providing a first impedance for the signal trace to a larger size providing a higher impedance for the signal trace.

21. The conductive plane of claim 18 wherein the conductors of the grid-like pattern of conductors vary in at least one of width and thickness along the length of the signal trace such that the grid elements vary in size along the length of the signal trace.

22. The conductive plane of claim 18 wherein the grid elements of the conductive plane vary in size such that the signal trace impedance varies in accordance with a ramp function along the length of the signal trace.

23. The conductive plane of claim 18 wherein the grid elements of the conductive plane vary in size such that the signal trace impedance varies in accordance with a staircase function along the length of the signal trace.

24. The conductive plane of claim 18 wherein the grid elements of the conductive plane vary in size such that the signal trace impedance varies in accordance with a square wave function along the length of the signal trace.

25. The conductive plane of claim 18 wherein the predetermined function is selected to compensate for capacitive loading on the signal trace.

26. An electronic circuit board comprising:

a signal trace plane;

a plurality of integrated circuits affixed to the circuit board and having pins connected to a signal trace of the signal trace plane; and a conductive plane arranged substantially parallel to the signal trace plane and separated therefrom by a dielectric material, wherein a portion of the conductive plane corresponding to the signal trace of the signal trace plane has a grid-like pattern of conductors forming grid elements which vary in size along at least a portion of a length of the signal trace to provide a signal trace impedance which varies along the length of the signal trace in accordance with a predetermined function.

27. The circuit board of claim 26 wherein the conductive plane comprises a ground plane.

28. The circuit board of claim 26 wherein the grid elements vary in size along the length of the signal trace from a first size providing a first impedance for the signal trace to a larger size providing a higher impedance for the signal trace.

29. The circuit board of claim 26 wherein the predetermined function is selected to compensate for capacitive loading on the signal trace.

30. The circuit board of claim 29 wherein the capacitive loading on the signal trace includes capacitive loading effects of the integrated circuits having pins connected to the signal trace.

31. The circuit board of claim 29 wherein the capacitive loading on the signal trace includes capacitive loading produced by an interconnection with another element of the circuit board.

32. The circuit board of claim 29 wherein the capacitive loading on the signal trace includes capacitive loading produced by an interconnection with an element external to the circuit board.

* * * * *